(12) United States Patent
Chen et al.

(10) Patent No.: US 9,931,664 B2
(45) Date of Patent: Apr. 3, 2018

(54) ROLL-TO-ROLL PRINTING SYSTEMS AND METHODS FOR FABRICATING PRINT ROLLER

(71) Applicant: The Chinese University of Hong Kong, Hong Kong (CN)

(72) Inventors: Shih-Chi Chen, Hong Kong (CN); Xi Zhou, Hong Kong (CN); Jiyi Cheng, Hong Kong (CN)

(73) Assignee: THE CHINESE UNIVERSITY OF HONG KONG, Hong Kong (CN)

( * ) Notice: Subject to any disclaimer, the term of this patent is extended or adjusted under 35 U.S.C. 154(b) by 587 days.

(21) Appl. No.: 14/057,320

(22) Filed: Oct. 18, 2013

(65) Prior Publication Data

US 2015/0107514 A1   Apr. 23, 2015

(51) Int. Cl.
| | | |
|---|---|---|
| *B05C 1/00* | (2006.01) | |
| *B05C 1/08* | (2006.01) | |
| *B41F 13/34* | (2006.01) | |
| *B41C 1/18* | (2006.01) | |

(52) U.S. Cl.
CPC .......... *B05C 1/0808* (2013.01); *B05C 1/0834* (2013.01); *B41C 1/184* (2013.01); *B41F 13/34* (2013.01); *B41C 1/18* (2013.01); *Y10T 156/10* (2015.01)

(58) Field of Classification Search
CPC ..... B41F 13/34; B05C 1/0808; B05C 1/0834; B41C 1/18; B41C 1/184; Y10T 156/10
See application file for complete search history.

(56) References Cited

U.S. PATENT DOCUMENTS

| 4,901,641 A | * | 2/1990 | Steiner | B41F 9/18 |
| | | | | 101/152 |
| 5,370,327 A | * | 12/1994 | Adamski | B65H 18/26 |
| | | | | 242/533.1 |
| 5,540,146 A | * | 7/1996 | Lapp | B41F 13/025 |
| | | | | 101/152 |
| 2002/0094220 A1 | * | 7/2002 | Bartscher | G03G 15/2007 |
| | | | | 399/341 |
| 2008/0163771 A1 | * | 7/2008 | Faist | B41F 7/40 |
| | | | | 101/248 |
| 2011/0146512 A1 | * | 6/2011 | Rogge | B41F 5/24 |
| | | | | 101/248 |

* cited by examiner

*Primary Examiner* — David Banh
(74) *Attorney, Agent, or Firm* — Knobbe, Martens, Olson & Bear, LLP

(57) ABSTRACT

A multiple degrees of freedom control apparatus for a roll-to-roll printing system.

17 Claims, 4 Drawing Sheets

ROLL-TO-ROLL PRINTING SYSTEMS AND METHODS FOR FABRICATING PRINT ROLLER

TECHNICAL FIELD

The present application relates to a multiple degrees of freedom control apparatus for a roll-to-roll printing system, a method for fabricating a print roller to be used in a roll-to-roll printing system, as well as a contact pressure control apparatus for a roll-to-roll printing system.

BACKGROUND

Although compatibility with roll-to-roll (RTR) processes is the main driving force for organic PV and solution processed PV technologies (when compared with lithographic processes), there is a common misperception that this high throughput, low-cost process produces devices of lower resolution and quality. This will not be true if contact printing techniques such as Microcontact Printing or Nanoimprint to properly designed RTG platforms. In fact, the printing resolution can be significantly better than photolithographic processes as contact printing are not limited by diffraction. Complex high resolution patterns of tens of nanometers have been repeatedly demonstrated by the aforementioned techniques at laboratory scale. However, it is not practical to directly scale up and apply these techniques to present state-of-the-art RTR systems, e.g. gravure printing and flexographic printing.

With the present application, the nanometer-resolution contact printing technologies can be scaled up for industrial implementations.

SUMMARY

In an aspect of the present application, there is provided a multiple degrees of freedom control apparatus for a roll-to-roll printing system comprising a print roller. The apparatus may comprise a first mechanism and a first set of activators. The first mechanism may comprise two monolithic flexures configured to support the opposite ends of the print roller, respectively. The first set of activators can be arranged to act on respective monolithic flexures so as to control the print roller in a first, second, third, and forth degrees of freedom, respectively.

In an aspect of the present application, there is provided a method for fabricating a print roller to be used in a roll-to-roll printing system. The method may comprises: transferring patterns to be printed in the roll-to-roll printing system from a silicon wafer to a first layer of PDMS coated on the silicon wafer; and bonding the first layer of PDMS with a second layer of PDMS of the print roller so as to bond an elastomeric stamp onto the print roller.

BRIEF DESCRIPTION OF THE DRAWINGS

The drawings described herein are used to provide a further understanding to the present application and constitute a part of this specification. Exemplary embodiments of the present application and their descriptions serve to explain the present application and do not constitute improper limitations on the present application. In the drawings.

DETAILED DESCRIPTION

Hereinafter, the present application will be explained in detail with reference to the accompanying drawings in connection with embodiments thereof.

Figure 1:
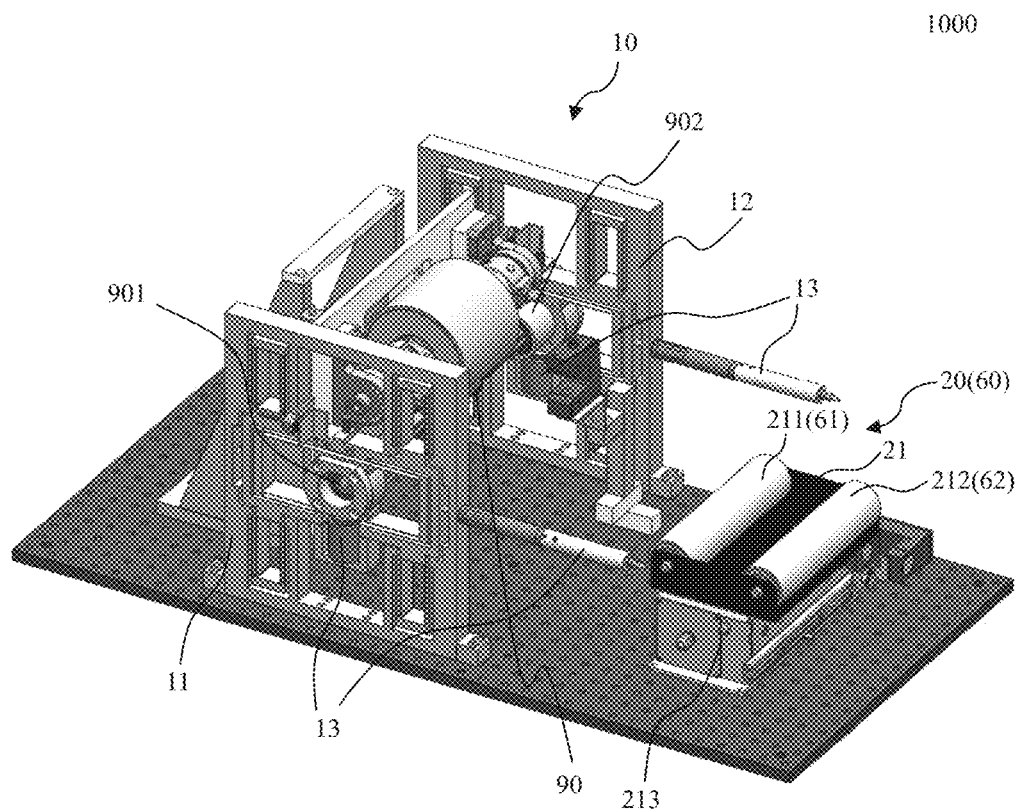
FIG. 1 shows a schematic perspective view of a multiple degrees of freedom control apparatus for a roll-to-roll printing system according to an embodiment of the present application.
Figure 2:
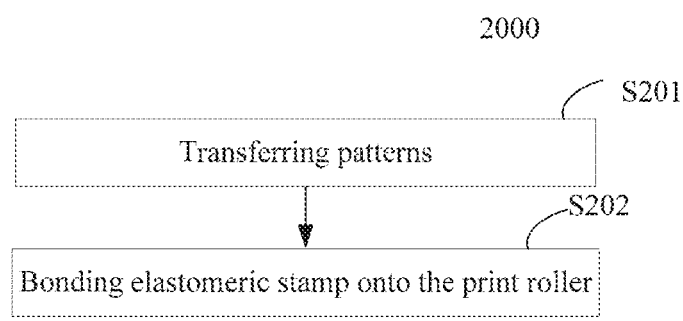
FIG. 2 shows a flow chart for a method for fabricating a print roller to be used in a roll-to-roll printing system according to an embodiment of the present application.

With reference to FIG. 1, a multiple degrees of freedom control apparatus according to an embodiment of the present application is shown. As shown in FIG. 1, the multiple degrees of freedom control apparatus 1000 may be used for a roll-to-roll printing system which comprises a print roller 90 having two ends 901 and 902. The printer roller 90 may be is made of transparent materials, for example, glass or quartz. FIG. 2 illustrates a method 2000 for fabricating a print roller to be used in a roll-to-roll printing system.

As shown in FIG. 2, in step S201, A plurality of patterns to be printed in the roll-to-roll printing system from 400 is transferred from a silicon wafer to a first layer of PDMS coated on the silicon wafer, and then in step S202 the first layer of PDMS is bonded with a second layer of PDMS of the print roller so as to bond an elastomeric stamp onto the print roller. For example, the print roller coated with the second layer of PDMS may be rolled along the silicon wafer coated with the first layer of PDMS such that the first and second layer of PDMS can be bonded tightly with each other.

In one embodiment, before step 201, the method 2000 may further comprise dip-coating the print roller with a second layer of PDMS by lowering the print roller within a body of PDMS; and spinning the print roller and simultaneously moving the print roller apart from the body of PDMS such that the print roller is coated with the second layer of PDMS. In addition, before the step 201 of transferring, the first layer of PDMS may be spin-coated on the silicon wafer having the patterns; and then the first layer of PDMS is cured on the silicon wafer such that the patterns are transferred to the first layer of PDMS. In addition, the print roller coated with the second layer of PDMS and the silicon wafer coated with the first layer of PDMS may be treated by means of plasma (for example, oxygen plasma), so as to improve the adhesion between the first and second layers of PDMS.

Referring to FIG. 1 again, the apparatus 1000 may comprise a first mechanism 10 for controlling the motion of the print roller 90 in a first, a second, a third, and a forth degrees of freedom, respectively. In one embodiment, the roll-to-roll printing system comprises a web 41 (FIG. 6) to be printed. The first mechanism 10 is configured such that any of opposite ends 901 and 902 of the print roller 90 independently moves in a first and a second directions perpendicular to each other, so as to control the print roller 90 in respect of the first, second, third, and forth degrees of freedom, respectively. To be specific, the first mechanism 10 may comprise two monolithic flexures 11 and 12 and a first set of activators 13. The flexures 11 and 12 are configured to support the opposite ends of the print roller 90, respectively, and the activators 13 are arranged to act on respective monolithic flexures so as to control the print roller 90 in a first, a second, a third, and a forth degrees of freedom, respectively. For example, two (or more) motors can be used as activators 13.

Figure 4:
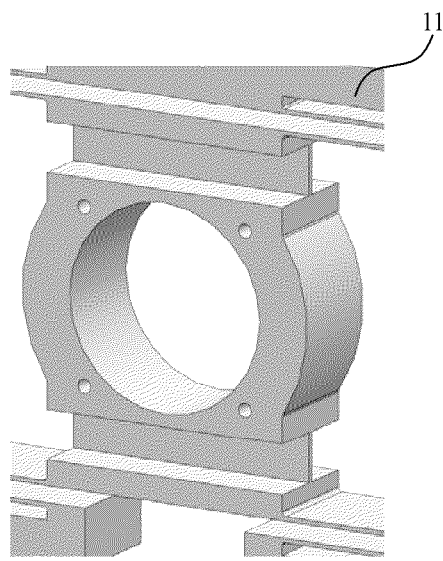
FIG. 4 shows a schematic perspective view illustrating a part of a monolithic flexure according to an embodiment of the present application.
Figure 5:
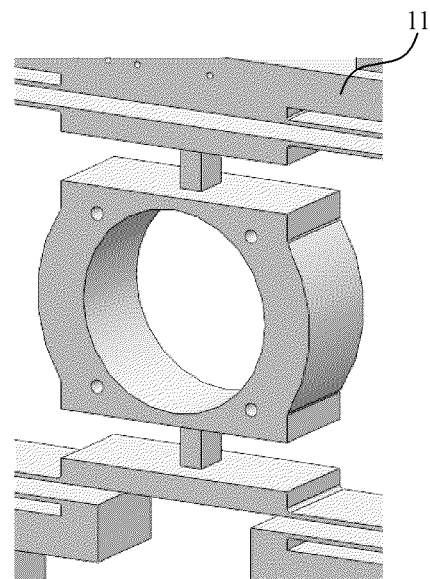
FIG. 5 shows a schematic perspective view illustrating a part of a monolithic flexure according to an alternative embodiment of the present application.

According to the embodiments of the present application, each of the two monolithic flexures 11 and 12 may be configured in a multiple-folded-beam construction so as to generate decoupled and independent motions of the print roller 90. Each monolithic flexure further comprises a center stage for bearing an end of the printing roller, and the center stage is configured to be connected with the other portion of the monolithic flexure though a leaf structure or a single-beam structure, as shown in FIGS. 4 and 5.

Figure 3:
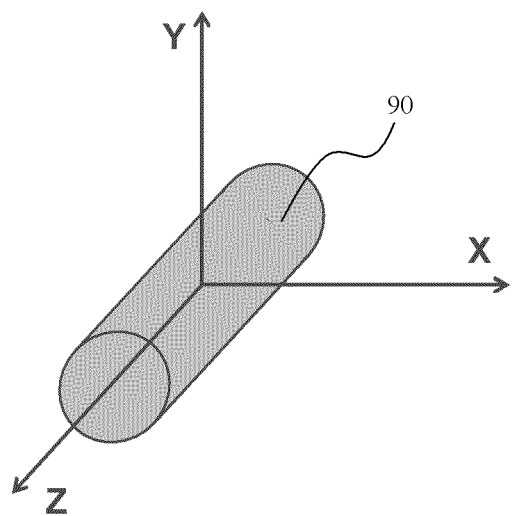
FIG. 3 shows a conceptual view for illustrating degrees of freedom of a print roller.

FIG. 3 shows a conceptual view of a print roller, where two monolithic flexures 11 and 12 (FIG. 1) of compliant mechanisms are used to support the two ends of the print roller 90. Each of the two monolithic flexures 11 and 12 is configured to generate decoupled and independent motions. This is achieved via using multiple folded beam mechanisms that increase the elastic deformation range as well as to decouple the in-plane motions. Moreover this design enables the two actuators (for X and Y directions) to work independently, where the Y actuators is moving with the entire frame when the X actuator is in operation.

The installed print roller 90 can couple the motions of the two monolithic flexures 11 and 12 (FIG. 1). Therefore, the bearing mount (i.e. the center stage of the block) is support by a leaf or single beam flexure to decouple the cross-block motion coupling effects.

This arrangement for flexures 11 and 12 generates 4 degrees of freedom error correction capability, i.e. translation along axis x, y, and rotation about x, y. Each flexure block provides decoupled motion guidance capability in two independent axes. In one embodiment, the stepper motor (not shown) may be connected to the shaft of the print roller 90 with an elastomeric coupler. The two flexure stages 11 and 12 may be driven by H2W's voice coil actuators in the y direction and the stepper motor, such as PI's stepper motor actuators, i.e. M230.10S, in the x direction respectively. Their positions are monitored by 2 pairs of capacitance probes (not shown) and eddy current sensors (not shown). These sensors provide high bandwidth (15 kHz) real-time position feedback for implementing closed-loop control. In addition, two load cells of 0.05 N resolution (TS-25-PC, MAGPOWR.) are placed at two ends of the impression roller to provide real-time force feedback and control the parallelism between the impression roller and the print roller 90.

Referring FIG. 1 again, the apparatus 1000 further comprises a second mechanism 20 for controlling a roller in a fifth degree of freedom, and a third mechanism 30 for controlling a roller in a sixth degree of freedom. For example, two (or more) motors may be used as activators to control the web position (6th DOF) as well as to maintain a controlled and uniform web tension.

In one embodiment as shown in FIG. 1, the second mechanism 20 may be configured such that the web 41 can move transversely to its running direction so as to control a roller in the fifth degree of freedom. In particular, as shown in FIG. 1, the second mechanism 20 may comprise a web-guiding unit 21 and second set of activators 22. The web-guiding unit 21 may comprises at least two upper rollers 211, 212 and a lower rotary frame 213 for supporting and rotating along with the upper rollers. The second set of activators 22 are arranged to be connected to the lower rotary frame 213 for enabling rotation of the lower rotary frame 213 and thus of the two upper rollers 211, 212. The third mechanism 30 may be configured to spin a roller so as to control the roller in the sixth degree of freedom. The third mechanism 30 may further comprise a third set of activators arranged to be connected to the roller so as to use a motor and flexible coupler to spin the roller.

In one embodiment (also referring to FIG. 1), the lateral position of the web is controlled by a web-guiding module 60. The module 60 consists of four rollers, and two of the upper rollers 61 and 62 are affixed to a rotary stage controlled by a servo motor (now shown). The actual position of the web is detected by two infrared edge sensors (now shown). When the rollers in the upper frame are rotated, the unbalanced friction force causes the web to move in the lateral (z) direction. This arrangement ensures the web path can be corrected within a short distance with minimized stress in the web.

Figure 6:
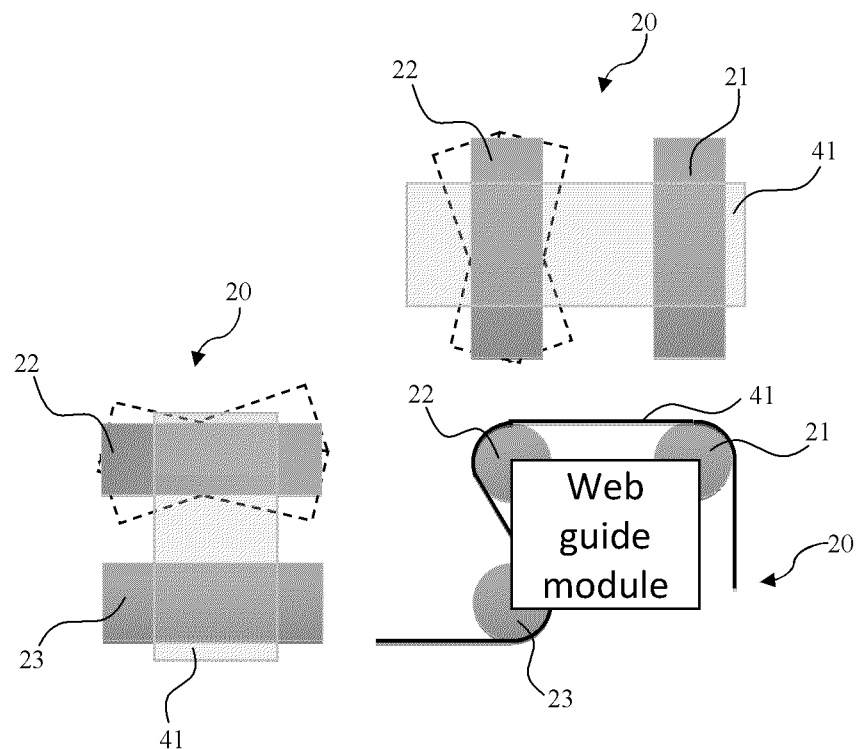
FIG. 6 shows a schematic view illustrating a second mechanism according to a further embodiment of the present application.

In another embodiment as shown in FIG. 6, the second mechanism 20 may comprise at least three guiding rollers 22, 23, 24 on which the web 41 is guided. At least one of the guiding rollers 22, 23, 24 is configured to swing in an in-plane or out-of-plane manner such that the web 41 can move transversely to its running direction. In addition, the second set of activators 22 may be also arranged in the second mechanism 20 and are connected to the guide roller and enable the swing. In this embodiment, the third set of activators may also be arranged in the third mechanism to use a motor and flexible coupler to spin the print roller 90.

Figure 7:
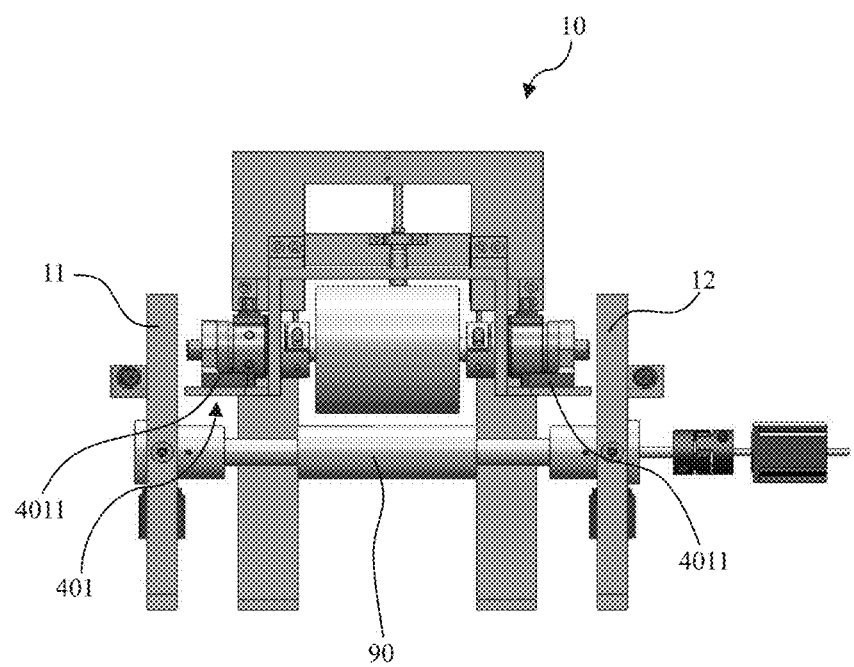
FIG. 7 shows a schematic end view of a multiple degrees of freedom control apparatus for a roll-to-roll printing system according to an embodiment of the present application.

As shown in FIG. 7, a contact pressure control apparatus 401 may be also arranged in the roll-to-roll printing system 400. As shown, the apparatus 401 comprises one or more sensors 4011 configured to be connected to a roller so as to determine a contact pressure between the roller and the web 41 in a real time manner. To ensure stable operation, air bearings are used to guide the motions of both the impression roller and the print roller 90. Two load cells are also installed by the impression roller to monitor the printing force in real time. Closed-loop web tension control is achieved through the use of a magnetic particle break/clutch and tension sensor.

In one aspect, the two flexure stages are driven by H2W's voice coil actuators in the y direction and PI's stepper motor actuators, i.e. M230.10S, in the x direction respectively. Their positions are monitored by 2 pairs of capacitance probes and eddy current sensors. These sensors provide high bandwidth (15 kHz) real-time position feedback for implementing closed-loop control. In addition, two load cells of 0.05 N resolution (TS-25-PC, MAGPOWR.) are placed at two ends of the impression roller to provide real-time force feedback and control the parallelism between the impression and print rollers. The lateral position of the web is controlled by a web-guiding module. The module consists of four rollers, and two of the upper rollers are affixed to a rotary stage controlled by a servo motor. The actual position of the web is detected by two infrared edge sensors. When the rollers in the upper frame are rotated, the unbalanced friction force causes the web to move in the lateral (z) direction. This arrangement ensures the web path can be corrected within a short distance with minimized stress in the web.

To adapt the MCP process for R2R operation, we replace the normal silicon/glass substrates with 4" wide metal coated PET rolls. In the printing process, the web tension, printing load, substrate-stamp wrap angle, and print roller position need to be precisely controlled. For stamp preparation, PDMS stamps are fabricated by a standard spin-coating procedure, following which the stamp is treated with oxygen plasma and subsequently rolled and securely bonded onto a glass tube. The glass tube is then affixed to the motor-driven print roller through friction generated by the air-expanding unit on the print roller.

To ensure stable operation, air bearings are used to guide the motions of both the impression and print rollers. Two load cells are also installed by the print roller to monitor the printing force in real time. Closed-loop web tension control is achieved through the use of a magnetic particle break/clutch and tension sensor.

Features, integers, characteristics, or combinations described in conjunction with a particular aspect, embodiment, implementation or example disclosed herein are to be understood to be applicable to any other aspect, embodiment, implementation or example described herein unless incompatible therewith. All of the features disclosed in this application (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments and extends to any novel one, or any novel combination, of the features disclosed in this specification (including any accompanying claims, abstract and drawings), or to any novel one, or any novel combination, of the steps of any method or process so disclosed.

What is claimed is:

1. A roll-to-roll printing system, comprising:
 a print roller configured to print on a web;
 an impression roller configured to impress the web onto the print roller such that the web is printed by the print roller; and
 a multiple degrees of freedom control apparatus, the apparatus comprising:
 a first set of activators; and
 a first mechanism comprising:
 two integral flexures configured to support opposite ends of the print roller, respectively, wherein the first set of activators are arranged to act on the two integral flexures, causing elastic deformation of the two integral flexures such that each of the opposite ends of the print roller supported by one of the two integral flexures independently moves in a first and a second directions perpendicular to each other, so as to control the print roller in respect of four degrees of freedom, and each of the integral flexures comprises:
 a center stage for bearing one of the ends of the print roller;
 a stationary frame;
 an intermediate stage between the center stage and the stationary frame;
 a single-piece leaf or single-beam structure for connecting the center stage with the intermediate stage of the integral flexure, wherein the single-piece leaf or single-beam structure is configured to deform so as to provide the four degrees of freedom of movement of the print roller.

2. The system of claim 1, further comprising:
 a second mechanism for controlling the web.

3. The system of claim 1, wherein the first mechanism is configured such that any of opposite ends of the print roller independently moves in a first and a second directions perpendicular to each other.

4. The system of claim 2, wherein the second mechanism is configured such that the web is capable of moving transversely to its running direction.

5. The system of claim 4, further comprising a third mechanism for controlling the print roller, wherein the third mechanism is configured to spin the print roller.

6. The system of claim 4, wherein the second mechanism comprises:
 a web-guiding unit with at least two upper rollers and a lower rotary frame for supporting and rotating along with the upper rollers; and
 a second set of activators arranged to be connected to the lower rotary frame for enabling rotation of the lower rotary frame and thus of the two upper rollers.

7. The system of claim 4, wherein the second mechanism comprises:
 at least three guiding rollers on which the web is guided, at least one of the guiding rollers is configured to swing in an in-plane or out-of-plane manner such that the web can move transversely to its running direction; and
 a second set of activators connected to the guide rollers and enable the swing.

8. The system of claim 1, wherein the print roller is made of transparent materials.

9. The system of claim 8, wherein the transparent materials comprise glass or quartz.

10. The system of claim 1, further comprising a contact pressure control apparatus,
 wherein the apparatus comprises sensors configured to be connected to the impression roller so as to determine a contact pressure distribution between the impression roller and the web in a real time manner.

11. The system of claim 10, wherein the sensors comprise two load cells which are affixed to opposite ends of the impression roller, respectively.

12. A method for fabricating the roll-to-roll printing system of claim 1, comprising:
 transferring patterns to be printed in the roll-to-roll printing system from a silicon wafer to a first layer of PDMS coated on the silicon wafer;
 bonding the first layer of PDMS with a second layer of PDMS of the print roller so as to bond an elastomeric stamp onto the print roller;
 locating the impression roller above the print roller; and
 connecting the impression roller and the print roller to the apparatus.

13. The method of claim 12, wherein the method further comprises, before the transferring, dip-coating the print roller with a second layer of PDMS.

14. The method of claim 13, wherein the dip-coating comprises:
 lowering the print roller within a body of PDMS; and
 spinning the print roller and simultaneously moving the print roller apart from the body of PDMS such that the print roller is coated with the second layer of PDMS.

15. The method of claim 14, wherein the method further comprises, before the transferring:
 spin-coating the first layer of PDMS on the silicon wafer having the patterns; and
 curing the first layer of PDMS on the silicon wafer such that the patterns are transferred to the first layer of PDMS.

16. The method of claim 15, wherein the bonding comprises rolling the print roller coated with the second layer of PDMS along the silicon wafer coated with the first layer of PDMS such that the first and the second layers of PDMS are bonded tightly with each other.

17. The method of claim 16, wherein the method comprises, after the transferring and before the bonding,
- treating, by means of plasma, the print roller coated with the second layer of PDMS and the silicon wafer coated with the first layer of PDMS so as to improve the adhesion between the first and second layers of PDMS.

* * * * *